United States Patent
Ota et al.

(10) Patent No.: US 7,986,050 B2
(45) Date of Patent: Jul. 26, 2011

(54) EPOXY RESIN COMPOSITION FOR OPTICAL SEMICONDUCTOR ELEMENT ENCAPSULATION AND OPTICAL SEMICONDUCTOR DEVICE USING THE SAME

(75) Inventors: Shinya Ota, Ibaraki (JP); Kazuhiro Fuke, Ibaraki (JP); Chisato Goto, Ibaraki (JP); Hisataka Ito, Ibaraki (JP); Takashi Taniguchi, Ibaraki (JP); Kazuhiko Yoshida, Yokohama (JP); Masao Gunji, Sodegaura (JP); Seigou Takuwa, Funabashi (JP)

(73) Assignee: Nitto Denko Corporation, Osaka (JP)

( * ) Notice: Subject to any disclaimer, the term of this patent is extended or adjusted under 35 U.S.C. 154(b) by 179 days.

(21) Appl. No.: 12/509,764

(22) Filed: Jul. 27, 2009

(65) Prior Publication Data

US 2010/0019271 A1    Jan. 28, 2010

(30) Foreign Application Priority Data

Jul. 28, 2008 (JP) .................. 2008-193449
Jul. 28, 2008 (JP) .................. 2008-193450
May 20, 2009 (JP) .................. 2009-122041

(51) Int. Cl.
*H01L 23/28* (2006.01)
*H01L 23/29* (2006.01)

(52) U.S. Cl. ......... 257/790; 257/787; 257/793; 257/795

(58) Field of Classification Search .................. 257/787, 257/790, 793, 795
See application file for complete search history.

(56) References Cited

U.S. PATENT DOCUMENTS 6,878,448 B2 * 4/2005 Ishii et al. .................. 428/413
(Continued)

FOREIGN PATENT DOCUMENTS

JP         2006-93277 A    4/2006

*Primary Examiner* — Matthew C Landau
*Assistant Examiner* — James M Mitchell

(74) *Attorney, Agent, or Firm* — Sughrue Mion, PLLC

(57) ABSTRACT

The present invention relates to an epoxy resin composition for optical semiconductor element encapsulation, the epoxy resin composition including following components (A) to (C):

(A) an epoxy resin represented by the following structural formula (1):

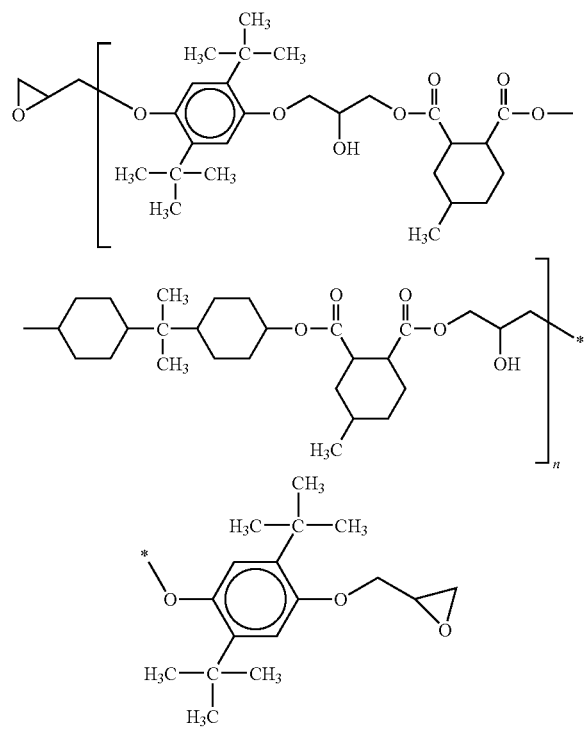

in which n is a positive number,
(B) an epoxy resin except for the epoxy resin represented by the structural formula (1), and
(C) a curing agent.

9 Claims, 1 Drawing Sheet

U.S. PATENT DOCUMENTS

| | | | |
|---|---|---|---|
| 7,157,313 B2* | 1/2007 | Kuroda | 438/127 |
| 7,906,378 B2* | 3/2011 | Itoh | 438/127 |
| 2005/0069715 A1* | 3/2005 | Hayakawa et al. | 428/413 |
| 2005/0090044 A1* | 4/2005 | Kayaba et al. | 438/127 |
| 2006/0154079 A1* | 7/2006 | Nishikawa | 428/413 |
| 2006/0216520 A1* | 9/2006 | Osada | 428/413 |

* cited by examiner

EPOXY RESIN COMPOSITION FOR OPTICAL SEMICONDUCTOR ELEMENT ENCAPSULATION AND OPTICAL SEMICONDUCTOR DEVICE USING THE SAME

FIELD OF THE INVENTION

The present invention relates to an epoxy resin composition for optical semiconductor element encapsulation, which is used for encapsulation of various optical semiconductor elements, and relates to an optical semiconductor device obtained by encapsulating an optical semiconductor element with the epoxy resin composition.

BACKGROUND OF THE INVENTION

Conventionally, an epoxy resin composition has been used from the standpoint that the encapsulating material for an optical semiconductor element such as light-receiving element and light-emitting element must be excellent in transparency, moisture resistance and heat resistance. The epoxy resin is, for example, transfer-molded in a forming mold having placed therein an optical semiconductor element, whereby the optical semiconductor element is formed as a package to obtain an optical semiconductor device (see, for example, JP-A-2006-93277).

Similarly to a semiconductor package other than an optical semiconductor, also in the optical semiconductor package, for the purpose of reducing the size or weight or enhancing the mounting productivity, surface mount technology is rapidly spreading instead of the conventional through hole mount technology. Examples of such a surface mount-type package include a two-way flat package (small outline package (SOP)), a four-way flat package (quad flat package (QFP)) and SON (small outline non-lead).

In the surface mount technology, unlike the through hole mount technology, the package as a whole is exposed to a high-temperature environment up to 260° C. in mounting practice. At this time, moisture absorbed during storage after the production of an optical semiconductor device abruptly vaporizes and expands to generate a large stress. In the case where this stress exceeds the package strength, cracking occurs in the package. In order to prevent such a problem, the optical semiconductor manufacturers take a countermeasure of shipping the optical semiconductor device in a moisture-proof pack or in the field of mounting, adding a step of, for example, heating and drying the optical semiconductor device in an oven before the mounting step. However, there is involved a cost rise due to moisture-proof packing, bad workability due to packing and unpacking, or a large burden due to the cost of heating and drying. The approach in general for solving the problem of cracking of the encapsulating resin due to water vapor includes a method of incorporating a large amount of a high-strength structural material such as filler into the encapsulating resin, but in the usage for an optical semiconductor, from the standpoint of transparency, it is difficult to use the technique of incorporating a large amount of a high-strength structural material such as filler. Also, an approach of increasing the content of an aliphatic group or a phenyl group to reduce the water absorption of the resin per se and thereby raising the soldering resistance effect may be considered. However, since the glass transition temperature (Tg) of the epoxy resin composition is high and the elastic modulus during solder reflow rises, the stress due to vaporization and expansion when performing reflow cannot be relieved and generation of cracking occurs. As for the technique of reducing the elastic modulus during solder reflow, a method of decreasing the glass transition temperature (Tg) of the epoxy resin composition may be considered. However, this method has a problem in that the temperature cycle reliability is significantly low and the product reliability is not satisfied.

SUMMARY OF THE INVENTION

Under these circumstances, the present invention has been made and an object of the present invention is to provide an epoxy resin composition for optical semiconductor element encapsulation, which has of course good transparency and is excellent in cracking resistance during solder reflow and at the same time, excellent in the temperature cycle test reliability, and an optical semiconductor device using the same and having high reliability.

That is, the present invention relates to the following 1. to 9.

1. An epoxy resin composition for optical semiconductor element encapsulation, the epoxy resin composition including following components (A) to (C):

(A) an epoxy resin represented by a following structural formula (1):

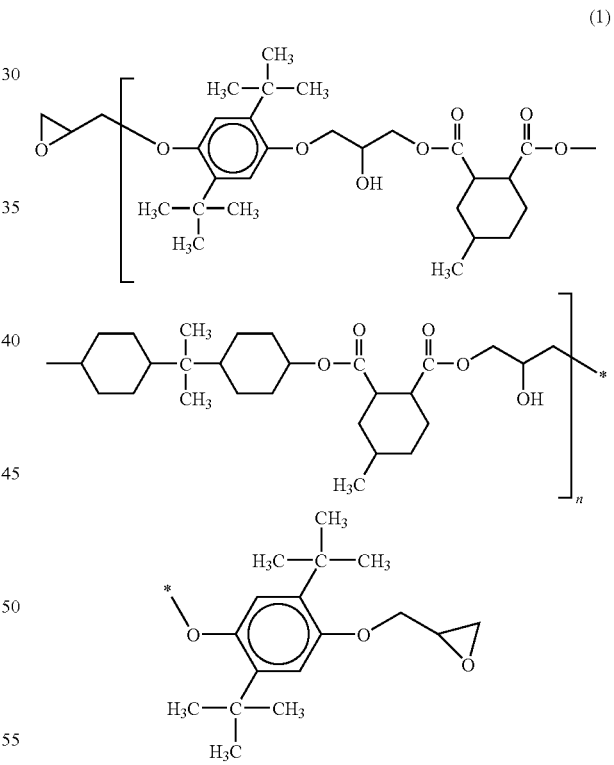

in which n is a positive number, (B) an epoxy resin except for the epoxy resin represented by the structural formula (1), and (C) a curing agent.

2. The epoxy resin composition according to 1., in which the epoxy resin (B) is an epoxy resin other than triglycidyl isocyanurate and an alicyclic epoxy resin represented by a following formula (2), and a mixing ratio (A)/(B) of the component (A) to the component (B) is 60/40 to 95/5 in terms of the weight ratio:

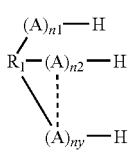

(2)

in which $R_1$ is an organic compound residue having at least one active hydrogen, the number of which is represented by y; n1 to ny each are 0 or an integer of 1 to 100, in which the sum of n1 to ny is 1 to 100; y is an integer of 1 to 100; and A is a cyclohexane skeleton represented by a following formula (a), which has a substituent Z:

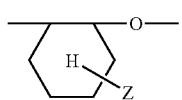

(a)

in which the substituent Z is

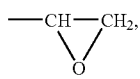

—CH=CH$_2$ or —CH(OH)—CH$_2$—OR$_2$; and R$_2$ is any one of hydrogen, an alkyl group, a carboalkyl group and a carboaryl group, provided that the alicyclic epoxy resin represented by the formula (2) at least contains one or more

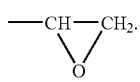

3. The epoxy resin composition according to 2., in which the epoxy resin (B) is at least one epoxy resin selected from the group consisting of a bisphenol A-type epoxy resin, a bisphenol F-type epoxy resin, 3,4-epoxycyclohexenylmethyl-3',4'-epoxycyclohexene carboxylate and a biphenyl-type epoxy resin represented by a following formula (3):

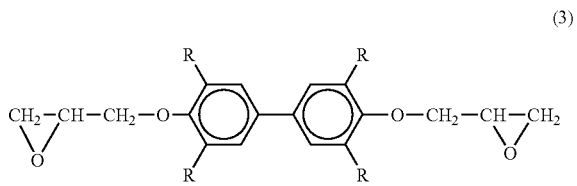

(3)

in which R's, which are the same or different, each represent a hydrogen atom or a methyl group.

4. The epoxy resin composition according to 2., having a glass transition temperature of 110° C. or more.

5. An optical semiconductor device obtained by transfer molding an optical semiconductor element with the epoxy resin composition according to 2. to encapsulate the optical semiconductor element.

6. The epoxy resin composition according to 1., in which the epoxy resin (B) is an epoxy resin other than a bisphenol A-type epoxy resin, a bisphenol F-type epoxy resin, 3,4-epoxycyclohexenylmethyl-3',4'-epoxycyclohexene carboxylate and a biphenyl-type epoxy resin represented by the formula (3) and a mixing ratio (A)/(B) of the component (A) to the component (B) is 70/30 to 95/5 in terms of the weight ratio.

7. The epoxy resin composition according to 6., in which the epoxy resin (B) is at least one of triglycidyl isocyanurate and an alicyclic epoxy resin represented by the formula (2).

8. The epoxy resin composition according to 6., having a glass transition temperature of 110° C. or more.

9. An optical semiconductor device obtained by transfer molding an optical semiconductor element with the epoxy resin composition according to 6. to encapsulate the optical semiconductor element.

The present inventors have made a series of studies to obtain an epoxy resin composition for optical semiconductor element encapsulation, which is excellent in cracking resistance during solder reflow. As a result, it has been found that when an epoxy resin represented by structural formula (1) (component (A)) and an epoxy resin other than that (component (B)) are combined in a specific ratio, the high-temperature elastic modulus at a solder reflow temperature (rubbery region) becomes low compared with conventional epoxy resins and the stress generated due to vaporization and expansion on performing reflow can be relieved, thereby ensuring that generation of cracking is of course suppressed to provide excellent solder reflow resistance and moreover, the glass transition temperature becomes high to also allow for enhancement in terms of temperature cycle test reliability. The present invention has been accomplished based on this finding.

In this way, the present invention relates to an epoxy resin composition for optical semiconductor element encapsulation, including an epoxy resin represented by structural formula (1) (component (A)) and an epoxy resin other than that (component (B)) in a specific mixing ratio. Accordingly, the epoxy resin composition for optical semiconductor element encapsulation of the present invention is excellent not only in the cracking resistance during solder reflow but also in the temperature cycle test reliability owing to its high glass transition temperature and becomes a useful encapsulating material and in turn, an optical semiconductor device with high reliability can be obtained.

DESCRIPTION OF REFERENCE NUMERALS AND SIGNS

Figure 1:
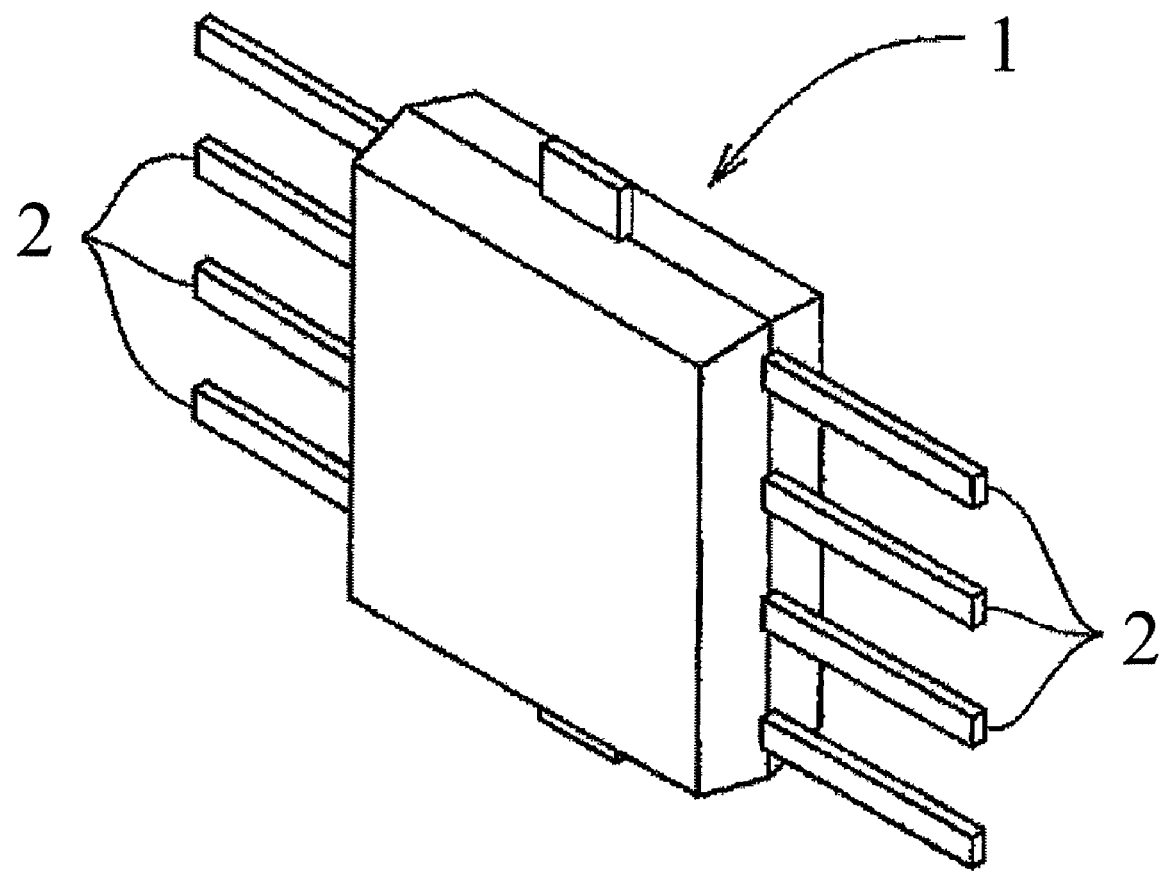
FIG. 1 is a perspective view showing SOP-8 that is one example of the surface mount-type optical semiconductor device.

1 Small outline package
2 Lead frame

DETAILED DESCRIPTION OF THE INVENTION

The embodiments of the present invention are described in detail below.

The epoxy resin composition for optical semiconductor element encapsulation (hereinafter simply referred to as an "epoxy resin composition") of the present invention is obtained using an epoxy resin represented by a specific structural formula (component A), an epoxy resin other than the component A (component B) and a curing agent (component C). The epoxy resin composition is usually in the form of a powder or a tablet obtained by tableting the powder.

The epoxy resin represented by a specific structural formula (component A) is an epoxy resin represented by the following structural formula (1):

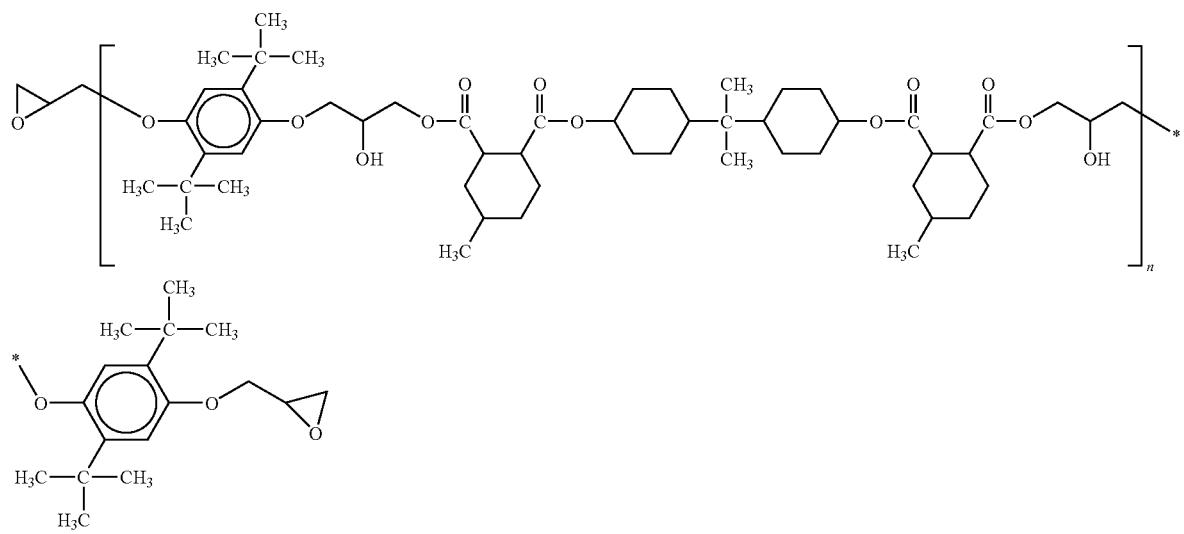
(1)

in which n is a positive number.

In formula (1), the repetition number n is a positive number, but n is preferably a number of 1 to 2. The epoxy equivalent is preferably from 400 to 1,300, more preferably from 400 to 800, and the softening point thereof is preferably from 50 to 130° C., more preferably from 70 to 110° C.

As a first embodiment of the present invention, the epoxy resin other than the component A (component B), used together with the component A, is preferably an epoxy resin except for triglycidyl isocyanurate and an alicyclic epoxy resin represented by the following formula (2):

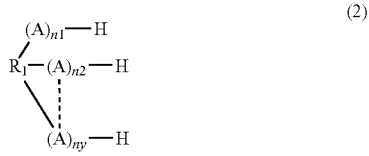
(2)

in which $R_1$ is an organic compound residue having at least one active hydrogen, the number of which is represented by y; $n1$ to $ny$ each are 0 or an integer of 1 to 100, in which the sum of $n1$ to $ny$ is from 1 to 100; y is an integer of 1 to 100; and A is a cyclohexane skeleton represented by the following formula (a), which has a substituent Z:

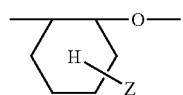
(a)

in which the substituent Z is

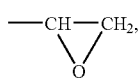

—CH=$CH_2$ or —CH(OH)—$CH_2$—$OR_2$, and $R_2$ is any one of hydrogen, an alkyl group, a carboalkyl group and a carboaryl group, provided that the alicyclic epoxy resin represented by the formula (2) at least contains one or more

Examples of the epoxy resin other than the component A (component B) include a bisphenol A-type epoxy resin, a bisphenol F-type epoxy resin, 3,4-epoxycyclohexenylmethyl-3',4'-epoxycyclohexene carboxylate and a biphenyl-type epoxy resin represented by the following formula (3). These may be used alone or in combination thereof

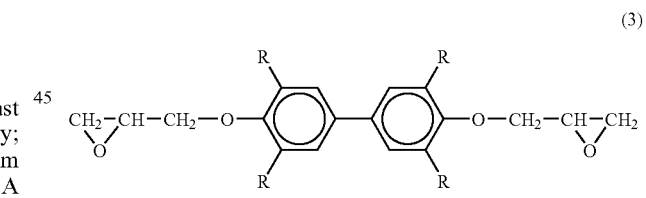
(3)

in which R's, which are the same or different, each represent a hydrogen atom or a methyl group.

The biphenyl-type epoxy resin represented by the formula (3) is preferably a biphenyl-type epoxy resin where R is a methyl group. Furthermore, as for the epoxy resin other than the component A (component B), it is preferred to use an epoxy resin having an epoxy equivalent of 80 to 250. Also, an epoxy resin having a softening or melting point of 40 to 125° C. is preferably used.

The mixing ratio (component A)/(component B) of the epoxy resin represented by structural formula (1) (component A) to the epoxy resin other than the component A (component B) is preferably from 60/40 to 95/5, more preferably from 70/30 to 90/10, in terms of the weight ratio. When the mixing ratio is out of the range above and the proportion of the component A is too small, the elastic modulus during solder reflow rises and the stress cannot be relieved, giving rise to a problem that cracking is generated in the characterization of solder reflow resistance. On the other hand, when the mixing ratio is out of the range above and the proportion of the component A is excessively large, although the glass transition temperature (Tg) becomes low and the solder reflow resistance is enhanced, the wire breakage occurs and reliability of the optical semiconductor device per se decreases in the temperature cycle test. Furthermore, the heat resistance lowers to cause serious discoloration during solder reflow and this affects the optical characteristics.

As a second embodiment of the present invention, the epoxy resin other than the component A (component B) used together with the component A is preferably an epoxy resin other than a bisphenol A-type epoxy resin, a bisphenol F-type epoxy resin, 3,4-epoxycyclohexenylmethyl-3',4'-epoxycyclohexene carboxylate and a biphenyl-type epoxy resin represented by the following formula (3):

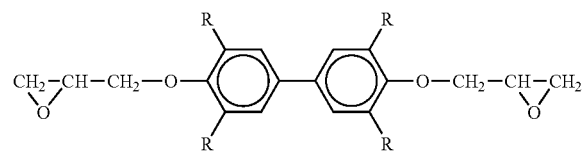

in which R's, which are the same or different, each represent a hydrogen atom or a methyl group.

Examples of the epoxy resin other than the component A (component B) include triglycidyl isocyanurate and an alicyclic epoxy resin represented by the following formula (2). These may be used alone or in combination thereof

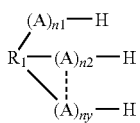

in which $R_1$ is an organic compound residue having at least one active hydrogen, the number of which is represented by y; n1 to ny each are 0 or an integer of 1 to 100, in which the sum of n1 to ny is from 1 to 100; y is an integer of 1 to 100; and A is a cyclohexane skeleton represented by the following formula (a), which has a substituent Z:

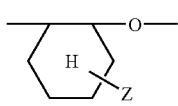

in which the substituent Z is

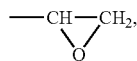

—CH=$CH_2$ or —CH(OH)—$CH_2$—$OR_2$, and $R_2$ is any one of hydrogen, an alkyl group, a carboalkyl group and a carboaryl group, provided that the alicyclic epoxy resin represented by the formula (2) at least contains one or more

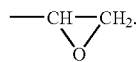

As for the epoxy resin other than the component A (component B), it is preferred to use an epoxy resin having an epoxy equivalent of 80 to 250. Also, an epoxy resin having a softening point of 40 to 125° C. is preferably used.

The mixing ratio (component A)/(component B) of the epoxy resin represented by structural formula (1) (component A) to the epoxy resin other than the component A (component B) is preferably from 70/30 to 95/5, more preferably from 75/25 to 90/10, in terms of the weight ratio. When the mixing ratio is out of the range above and the proportion of the component A is too small, the elastic modulus during solder reflow rises and the stress cannot be relieved, giving rise to a problem that cracking is generated in the characterization of solder reflow resistance. On the other hand, when the mixing ratio is out of the range above and the proportion of the component A is excessively large, although the glass transition temperature (Tg) becomes low and the solder reflow resistance is enhanced, the wire breakage occurs and reliability of the optical semiconductor device per se decreases in the temperature cycle test. Furthermore, the heat resistance lowers to cause serious discoloration during solder reflow and this affects the optical characteristics.

In the preferred first and second embodiments above of the present invention, the curing agent (component C) used together with the component A and the component B acts as a curing agent for the components A and B. Although a conventionally known curing agent for epoxy resin can be used, an acid anhydride-based curing agent is preferably used from the standpoint that the cured epoxy resin composition is hardly discolored.

Examples of the acid anhydride-based curing agent include colorless to pale yellow acid anhydrides such as phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, and methyltetrahydrophthalic anhydride. These acid anhydride-based curing agents may be used alone or in combination thereof Among these acid anhydride-based curing agents, in view of lower absorption in the short wavelength region, hexahydrophthalic anhydride and methylhexahydrophthalic anhydride are preferably used.

Other than the acid anhydride-based curing agent, a curing agent obtained by esterifying the above-described acid anhydride-based curing agent with glycols, or a curing agent such as carboxylic acids (e.g., hexahydrophthalic acid, tetrahydrophthalic acid, methylhexahydrophthalic acid) may be used alone, or two or more thereof may be used in combination.

The blending ratio of the epoxy resin component (component A+component B) to the curing agent (component C) is, for example, in the case of using an acid anhydride-based curing agent as the curing agent (component C), preferably set such that the acid anhydride equivalent in the acid anhydride-based curing agent becomes from 0.5 to 1.5 equivalents, preferably from 0.7 to 1.2 equivalents, based on one equivalent of the epoxy group in the epoxy resin component (component A+component B). When the acid anhydride equivalent in the blending ratio above is less than the lower limit, the obtained epoxy resin composition tends to have bad color hue after curing. On the other hand, when it exceeds the upper limit above, the moisture resistance is likely to decrease.

Incidentally, in the case where other than the acid anhydride-based curing agent, one of curing agents such as carboxylic acids (e.g., hexahydrophthalic acid) is used alone or in combination thereof as the curing agent (component C), the curing agent is also blended in accordance with the blending ratio (equivalent ratio) when using the acid anhydride-based curing agent.

The epoxy resin composition of the present invention may contain, according to the necessity, a curing accelerator. Examples of the curing accelerator include tertiary amines, imidazoles, quaternary ammonium salts, organic metal salts and phosphorus compounds. These curing accelerators may be used alone or in combination thereof Among these curing accelerators, phosphorus-based compounds and tertiary amines are preferred, and 1,8-diazabicyclo[5.4.0]undecene-7 (DBU), 1,5-diazabicyclo[4.3.0]nonene-5, octylate of DBU, N,N-dimethylbenzylamine, tetra-n-butylphosphonium-o,o-diethylphosphorodithioate and N,N-dimethylcyclohexylamine are more preferred. Use of such a curing accelerator produces an effect that heat-resistant discoloration scarcely occurs at the solder reflow temperature.

The blending amount of the curing accelerator is preferably set to a range from 0.05 to 7.0 parts by weight (hereinafter simply referred to as "parts"), more preferably from 0.2 to 3.0 parts, based on 100 parts of the epoxy resin component (component A+component B). When the blending amount of the curing accelerator is too small, a sufficiently high curing accelerating effect is unlikely to be obtained. On the other hand, when it is excessively large, the cured epoxy resin composition tends to be discolored.

In the epoxy resin composition of the present invention, in addition to the epoxy resin represented by structural formula (1) (component A), the epoxy resin other than the component A (component B), the curing agent (component C) and the curing accelerator, conventionally known various additives that have been heretofore used, such as deterioration inhibitor, modifier, silane coupling agent, defoaming agent, release agent, dye and pigment, may be appropriately blended according to the necessity, within the range not impairing the transparency of the cured epoxy resin composition.

Examples of the deterioration inhibitor include conventionally known deterioration inhibitors such as phenolic compound, amine-based compound, organic sulfur-based compound and phosphine-based compound.

Examples of the modifier include conventionally known modifiers such as glycols, silicones and alcohols.

Examples of the silane coupling agent include conventionally known silane coupling agents such as silane type and titanate type.

Examples of the defoaming agent include conventionally known defoaming agents such as silicone type.

Examples of the release agent include conventionally known release agents such as steric acid, behenic acid, montanic acid, metal salts thereof, polyethylene type, polyethylene-polyoxyethylene type and carnauba wax. Among these, a polyethylene-polyoxyethylene-based mold release agent is preferred because of good transparency of the cured epoxy resin composition.

In the case where light dispersibility is required, filler may be further blended in addition to the above-described components. Examples of the filler include an inorganic filler such as quartz glass powder, talc, silica powder, alumina powder and calcium carbonate.

The epoxy resin composition of the present invention can be produced, for example, as follows. That is, the components A, B and C and, according to the necessity, conventionally known various additives such as curing accelerator, deterioration inhibitor, modifier, defoaming agent, release agent, dye, pigment and filler are blended in a predetermined ratio. These are mixed and kneaded by appropriately employing a dry blend method or a melt blend method in the usual manner. Subsequently, the resulting kneaded product is cooled, ground and further tableted, according to the necessity, whereby the epoxy resin composition of the present invention can be produced.

Encapsulation of an optical semiconductor element by using such an epoxy resin composition can be performed in accordance with a known molding method such as transfer molding.

In the cured body of the epoxy resin composition of the present invention, the light transmittance at a wavelength of 600 nm as measured by a spectrophotometer with a thickness of 1 mm is preferably 70% or more, more preferably 80% or more. However, this does not apply to the light transmittance when the above-described filler, dye or pigment is used.

The cured body of the epoxy resin composition of the present invention preferably has a glass transition temperature (Tg) of 110° C. or more, more preferably from 110 to 150° C. Furthermore, the storage modulus at a temperature 50° C. higher than the glass transition temperature (Tg) above is preferably from 2 to 14 MPa, more preferably from 3 to 14 MPa. By virtue of having these properties, the epoxy resin composition of the present invention can be excellent in the solder reflow resistance and temperature cycle test reliability. Incidentally, as regards the glass transition temperature (Tg) above, for example, a cured epoxy resin composition is measured by a differential scanning calorimeter (DSC), and the midpoint of two folding points appearing before and after the glass transition temperature is determined as the glass transition temperature (Tg). Also, the storage modulus can be measured, for example, using a cured epoxy resin composition by RSA-II manufactured by RHEOMETRIC SCIENTIFIC under the measurement conditions of 1 Hz and 10° C./min in a temperature range of 30 to 270° C.

EXAMPLE

Examples and Comparative Examples are described together below, but the present invention is not limited to these Examples.

Examples in accordance with a first embodiment of the present invention and Comparative Examples are described below.

In advance of Examples and Comparative Examples, the components shown below were prepared.

Epoxy Resin a: Epoxy resin represented by structural formula (1) (in formula (1), n=1; epoxy equivalent: 540; ZX-1718-3 produced by Tohto Kasei Co., Ltd.)

Epoxy Resin b: Bisphenol A-type epoxy resin (epoxy equivalent: 185, liquid form)

Epoxy Resin c: Bisphenol F-type epoxy resin (epoxy equivalent: 170, liquid form)

Epoxy Resin d: Biphenyl-type epoxy resin represented by the following structural formula (b) (epoxy equivalent: 193, melting point: 105° C.):

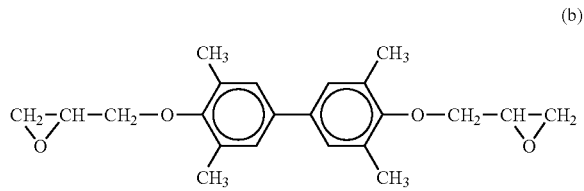

(b)

Epoxy Resin e: 3,4-Epoxycyclohexenylmethyl-3',4'-epoxycyclohexene carboxylate (epoxy equivalent: 134)

Curing Agent: Hexahydrophthalic anhydride

Curing Accelerator: N,N-Dimethylbenzylamine

Silane Coupling Agent: γ-Mercaptotrimethoxysilane

Examples 1 to 9 and Comparative Examples 1 to 9

Respective components shown in Tables 1 and 2 below were blended in a ratio shown in the Tables, melt-kneaded over 3 minutes in a mixing roll heated to 80 to 130° C., ripened, then cooled to room temperature (25° C.) and ground to thereby obtain the objective powdery epoxy resin composition.

Using the thus-obtained epoxy resin compositions of Examples and Comparative Examples, various characteristic evaluations were performed according to the methods described below. The results obtained are shown together in Tables 1 and 2.

Glass Transition Temperature (Tg)

Each of the epoxy resin compositions produced above was molded in an exclusive mold (curing conditions: molding of 150° C.×4 minutes) to produce a cured product specimen (size: 50 mm (diameter)×1 mm (thickness)). The specimen was heated at 150° C. for 3 hours to completely finish the curing. This specimen after completely finishing the curing was measured by a differential scanning calorimeter (DSC; DSC-6220, manufactured by Seiko Instruments Inc.), and the midpoint of two folding points appearing before and after the glass transition temperature was determined as the glass transition temperature (Tg).

Storage Modulus

Each of the epoxy resin compositions produced above was molded in an exclusive mold (curing conditions: molding of 150° C.×4 minutes) to produce a cured product specimen (size: 5 mm (width)×35 mm (length)×1 mm (thickness)). The specimen was heated at 150° C. for 3 hours to completely finish the curing. Using this specimen after completely finishing the curing, the storage modulus was measured by RSA-II manufactured by RHEOMETRIC SCIENTIFIC under the measurement conditions of 1 Hz and 10° C./min in a temperature range of 30 to 270° C. That is, the storage modulus is a measured value at a temperature 50° C. higher than the glass transition temperature (Tg) measured above.

Solder Reflow Resistance

An optical semiconductor element (SiN photodiode, 1.5 mm×1.5 mm×0.37 mm (thickness)) was molded with each of the epoxy resin compositions, produced above, by transfer molding (molding of 150° C.×4 minutes, post-curing of 150° C.×3 hours) to thereby obtain 10 units of surface mount-type optical semiconductor devices with respect to each of Examples and Comparative Examples. These surface mount-type optical semiconductor devices were, as shown in FIG. 1, 8-pin small outline packages (SOP-8, 4.9 mm×3.9 mm×1.5 mm (thickness)) 1, where a 42 alloy material having formed on the entire surface thereof a silver plating layer (thickness: 0.2 μm) was used as the lead frame 2. The wire diameter was 25 μm.

Each of 10 units of the optical semiconductor devices according to respective Examples and Comparative Examples were moisture-absorbed for 192 hours under the conditions of 30° C./60% RH and passed through an actual reflow furnace (top peak 260° C.×10 seconds) three times. Thereafter, delamination at the resin interface between the lead frame and the element and the presence or absence of cracks were observed with an eye through a microscope, and the number of units of the optical semiconductor device suffering from occurrence of delamination or cracking was counted.

Temperature Cycle Test

The optical semiconductor device evaluated above for solder reflow resistance was used and subjected to a temperature cycle test of 300 cycles with one cycle being from 100° C. to −40° C., and the breakage and conduction of wire were checked. Incidentally, the optical semiconductor device suffering from occurrence of delamination or cracking in the evaluation of solder reflow resistance above was not subjected to the temperature cycle test.

TABLE 1

(Unit: parts)

| | | Example | | | | | | | | |
|---|---|---|---|---|---|---|---|---|---|---|
| | | 1 | 2 | 3 | 4 | 5 | 6 | 7 | 8 | 9 |
| Epoxy Resin | a | 60.0 | 90.0 | 95.0 | 60.0 | 60.0 | 60.0 | 95.0 | 95.0 | 95.0 |
| | b | 40.0 | 10.0 | 5.0 | — | — | — | — | — | — |
| | c | — | — | — | 40.0 | — | — | 5.0 | — | — |
| | d | — | — | — | — | 40.0 | — | — | 5.0 | — |
| | e | — | — | — | — | — | 40.0 | — | — | 5.0 |
| Curing agent | | 49.8 | 33.5 | 30.8 | 52.7 | 48.4 | 48.4 | 31.2 | 30.7 | 30.7 |
| Silane coupling agent | | 1.00 | 1.00 | 1.00 | 1.00 | 1.00 | 1.00 | 1.00 | 1.00 | 1.00 |
| Curing accelerator | | 1.00 | 1.00 | 1.00 | 1.00 | 1.00 | 1.00 | 1.00 | 1.00 | 1.00 |
| Glass transition temperature (Tg) (° C.) | | 130 | 115 | 111 | 128 | 138 | 150 | 110 | 120 | 115 |
| Storage modulus (MPa), tan δ + 50° C. | | 13.8 | 6.0 | 3.0 | 13.0 | 12.0 | 14.0 | 3.4 | 3.8 | 4.0 |
| Solder reflow resistance (number of defective units/10 units) | | 0/10 | 0/10 | 0/10 | 0/10 | 0/10 | 0/10 | 0/10 | 0/10 | 0/10 |
| Temperature cycle test (100° C. ⇔ −40° C.) (number of defective units/10 units) | | 0/10 | 0/10 | 0/10 | 0/10 | 0/10 | 0/10 | 0/10 | 0/10 | 0/10 |

TABLE 2

(Unit: parts)

| | | Comparative Example | | | | | | | |
|---|---|---|---|---|---|---|---|---|---|
| | | 1 | 2 | 3 | 4 | 5 | 6 | 7 | 8 | 9 |
| Epoxy Resin | a | 50.0 | 50.0 | 50.0 | 50.0 | 100 | 97.0 | 97.0 | 97.0 | 97.0 |
| | b | 50.0 | — | — | — | — | 3.0 | — | — | — |
| | c | — | 50.0 | — | — | — | — | 3.0 | — | — |
| | d | — | — | 50.0 | — | — | — | — | 3.0 | — |
| | e | — | — | — | 50.0 | — | — | — | — | 3.0 |
| Curing agent | | 55.2 | 58.8 | 53.5 | 53.5 | 28.1 | 29.8 | 30.0 | 29.7 | 29.7 |
| Silane coupling agent | | 1.00 | 1.00 | 1.00 | 1.00 | 1.00 | 1.00 | 1.00 | 1.00 | 1.00 |
| Curing accelerator | | 1.00 | 1.00 | 1.00 | 1.00 | 1.00 | 1.00 | 1.00 | 1.00 | 1.00 |
| Glass transition temperature (Tg) (° C.) | | 141 | 139 | 150 | 160 | 100 | 105 | 103 | 107 | 108 |
| Storage modulus (MPa), tan δ + 50° C. | | 16.0 | 15.0 | 15.0 | 17.0 | 2.0 | 3.0 | 3.0 | 3.0 | 3.0 |
| Solder reflow resistance (number of defective units/10 units) | | 10/10 | 10/10 | 10/10 | 10/10 | 0/10 | 0/10 | 0/10 | 0/10 | 0/10 |
| Temperature cycle test (100° C. ⇔ −40° C.) (number of defective units/10 units)* | | ND | ND | ND | ND | 10/10 | 10/10 | 10/10 | 10/10 | 10/10 |

*As for the temperature cycle test of Comparative Examples 1 to 4, occurrence of delamination or cracking was confirmed in all of 10 units in the evaluation of the solder reflow resistance test and therefore, the optical semiconductor devices were not subjected to the temperature cycle test.

As seen from the results above, in all products of Examples, the glass transition temperature (Tg) was 110° C. or more and the storage modulus was kept low. Also, good results were obtained in the solder reflow resistance test and the temperature cycle test.

On the other hand, in the products of Comparative Examples 1 to 4 where the mixing ratio of two kinds of epoxy resins is out of the specific range and the proportion of Epoxy Resin a mixed is small, delamination and cracking were generated in the solder reflow resistance test. Also, in the products of Comparative Examples 6 to 9 where the mixing ratio of two kinds of epoxy resin is out of the specific range and the proportion of Epoxy Resin a mixed is excessively large, the storage modulus was kept low, but breakage or conduction failure of wire was generated in the temperature cycle test. Similarly, in the product of Comparative Example 5 using only Epoxy Resin a, the glass transition temperature (Tg) was as low as 100° C. and although the storage modulus was kept low, breakage or conduction failure of wire was generated in the temperature cycle test.

Examples in accordance with a second embodiment of the present invention and Comparative Examples are described below.

In advance of Examples and Comparative Examples, the components shown below were prepared.

Epoxy Resin f: Epoxy resin represented by structural formula (1) (in formula (1), n=1; epoxy equivalent: 540; ZX-1718-3 produced by Tohto Kasei Co., Ltd.)

Epoxy Resin g: Triglycidyl isocyanurate (epoxy equivalent: 100, softening point: 115° C.)

Epoxy Resin h: Alicyclic epoxy resin represented by the following structural formula (c) (epoxy equivalent: 185, softening point: 85° C.)

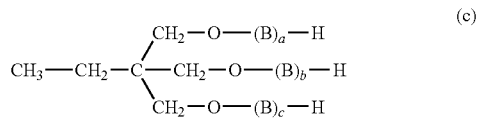

(c)

In formula (c), B is a cyclohexane skeleton represented by the following formula (d); and a, b and c are integers satisfying a+b+c=15:

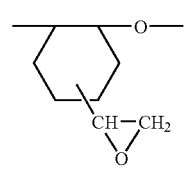

(d)

Curing Agent: Hexahydrophthalic anhydride
Curing Accelerator: N,N-Dimethylbenzylamine
Silane Coupling Agent: γ-Mercaptotrimethoxysilane

Examples 10 to 13 and Comparative Examples 10 to 14

Respective components shown in Tables 3 and 4 below were blended in a ratio shown in the Tables, melt-kneaded over 3 minutes in a mixing roll heated to 80 to 130° C., ripened, then cooled to room temperature (25° C.) and ground to obtain the objective powdery epoxy resin composition.

Using the thus-obtained epoxy resin compositions of Examples and Comparative Examples, characteristic evaluations of glass transition temperature, storage modulus, solder reflow resistance and temperature cycle test were performed according to the methods described above. The results obtained are shown together in Tables 3 and 4.

TABLE 3

(Unit: parts)

| | Example | | | |
|---|---|---|---|---|
| | 10 | 11 | 12 | 13 |
| Epoxy Resin f | 70.0 | 70.0 | 95.0 | 95.0 |
| g | 30.0 | — | 5.0 | — |
| h | — | 30.0 | — | 5.0 |
| Curing agent | 65.3 | 44.4 | 34.3 | 30.8 |
| Silane coupling agent | 1.0 | 1.0 | 1.0 | 1.0 |
| Curing accelerator | 0.5 | 0.5 | 0.5 | 0.5 |
| Glass transition temperature (Tg) (° C.) | 138.6 | 151.0 | 112.0 | 118.0 |
| Storage modulus (MPa), tan δ + 50° C. | 12.0 | 14.0 | 5.0 | 8.0 |

TABLE 3-continued (Unit: parts)

| | Example | | | |
|---|---|---|---|---|
| | 10 | 11 | 12 | 13 |
| Solder reflow resistance (number of defective units/10 units) | 0/10 | 0/10 | 0/10 | 0/10 |
| Temperature cycle test (100° C. ⇔ −40° C.) (number of defective units/10 units) | 0/10 | 0/10 | 0/10 | 0/10 |

TABLE 4

(Unit: parts)

| | | Comparative Example | | | | |
|---|---|---|---|---|---|---|
| | | 10 | 11 | 12 | 13 | 14 |
| Epoxy Resin | f | 60.0 | 60.0 | 100.0 | 97.0 | 97.0 |
| | g | 40.0 | — | — | — | — |
| | h | — | 40.0 | — | 3.0 | 3.0 |
| Curing agent | | 77.7 | 49.8 | 28.1 | 31.9 | 29.8 |
| Silane coupling agent | | 1.0 | 1.0 | 1.0 | 1.0 | 1.0 |
| Curing accelerator | | 0.5 | 0.5 | 0.5 | 0.5 | 0.5 |
| Glass transition temperature (Tg) (° C.) | | 150.0 | 170.0 | 100.0 | 106.0 | 108.0 |
| Storage modulus (MPa), tan δ + 50° C. | | 15.0 | 20.0 | 2.0 | 4.0 | 6.0 |
| Solder reflow resistance (number of defective units/10 units) | | 10/10 | 10/10 | 0/10 | 0/10 | 0/10 |
| Temperature cycle test (100° C. ⇔ −40° C.) (number of defective units/10 units)* | | ND | ND | 10/10 | 10/10 | 10/10 |

*As for the temperature cycle test of Comparative Examples 10 and 11, occurrence of delamination or cracking was confirmed in all of 10 units in the evaluation of the solder reflow resistance test and therefore, the optical semiconductor devices were not subjected to the temperature cycle test.

As seen from the results above, in all products of Examples, the glass transition temperature (Tg) was 110° C. or more and the storage modulus was kept low. Also, good results were obtained in the solder reflow resistance test and the temperature cycle test.

On the other hand, in the products of Comparative Examples 10 and 11 where the mixing ratio of two kinds of epoxy resins is out of the specific range and the proportion of Epoxy Resin f mixed is small, delamination and cracking were generated in the solder reflow resistance test. Also, in the products of Comparative Examples 13 and 14 where the mixing ratio of two kinds of epoxy resin is out of the specific range and the proportion of Epoxy Resin f mixed is excessively large, the storage modulus was kept low, but breakage or conduction failure of wire was generated in the temperature cycle test. Similarly, in the product of Comparative Example 12 using only Epoxy Resin f, the glass transition temperature (Tg) was as low as 100° C. and although the storage modulus was kept low, breakage or conduction failure of wire was generated in the temperature cycle test.

While the invention has been described in detail and with reference to specific embodiments thereof, it will be apparent to one skilled in the art that various changes and modifications can be made therein without departing from the spirit and scope thereof.

This application is based on Japanese Patent Applications (Patent Application No. 2008-193449 filed on Jul. 28, 2008, Patent Application No. 2008-193450 filed on Jul. 28, 2008 and Patent Application No. 2009-122041 filed on May 20, 2009), the entirety of which is incorporated herein by way of reference.

Also, all references cited herein are incorporated by reference herein in their entirety.

What is claimed is:

1. An epoxy resin composition for optical semiconductor element encapsulation, said epoxy resin composition comprising following components (A) to (C):
    (A) an epoxy resin represented by a following structural formula (1):

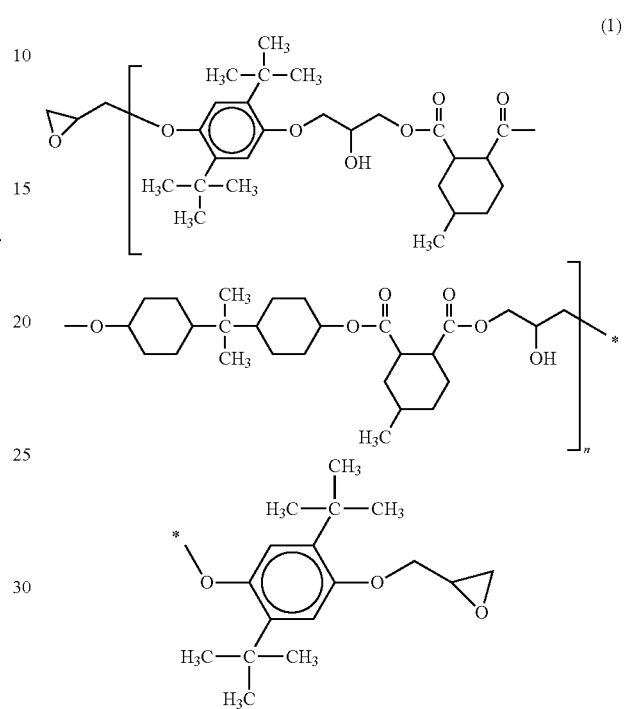

wherein n is a positive number,
    (B) an epoxy resin except for the epoxy resin represented by the structural formula (1), and
    (C) a curing agent.

2. The epoxy resin composition according to claim 1, wherein the epoxy resin (B) is an epoxy resin other than triglycidyl isocyanurate and an alicyclic epoxy resin represented by a following formula (2), and a mixing ratio (A)/(B) of the component (A) to the component (B) is 60/40 to 95/5 in terms of the weight ratio:

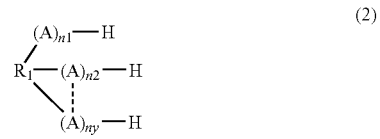

wherein $R_1$ is an organic compound residue having at least one active hydrogen, the number of which is represented by y; n1 to ny each are 0 or an integer of 1 to 100, in which the sum of n1 to ny is 1 to 100; y is an integer of 1 to 100; and A is a cyclohexane skeleton represented by a following formula (a), which has a substituent Z:

wherein the substituent Z is

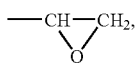

—CH=CH$_2$ or —CH(OH)—CH$_2$—OR$_2$; and R$_2$ is any one of hydrogen, an alkyl group, a carboalkyl group and a carboaryl group, provided that the alicyclic epoxy resin represented by the formula (2) at least contains one or more

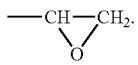

3. The epoxy resin composition according to claim 2, wherein the epoxy resin (B) is at least one epoxy resin selected from the group consisting of a bisphenol A-type epoxy resin, a bisphenol F-type epoxy resin, 3,4-epoxycyclohexenylmethyl-3',4'-epoxycyclohexene carboxylate and a biphenyl-type epoxy resin represented by a following formula (3):

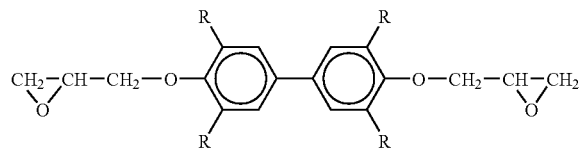

wherein R's, which are the same or different, each represent a hydrogen atom or a methyl group.

4. The epoxy resin composition according to claim 2, having a glass transition temperature of 110° C. or more.

5. An optical semiconductor device obtained by transfer molding an optical semiconductor element with the epoxy resin composition according to claim 2 to encapsulate the optical semiconductor element.

6. The epoxy resin composition according to claim 1, wherein the epoxy resin (B) is an epoxy resin other than a bisphenol A-type epoxy resin, a bisphenol F-type epoxy resin, 3,4-epoxycyclohexenylmethyl-3',4'-epoxycyclohexene carboxylate and a biphenyl-type epoxy resin represented by the formula (3) and a mixing ratio (A)/(B) of the component (A) to the component (B) is 70/30 to 95/5 in terms of the weight ratio.

7. The epoxy resin composition according to claim 6, wherein the epoxy resin (B) is at least one of triglycidyl isocyanurate and an alicyclic epoxy resin represented by the formula (2).

8. The epoxy resin composition according to claim 6, having a glass transition temperature of 110° C. or more.

9. An optical semiconductor device obtained by transfer molding an optical semiconductor element with the epoxy resin composition according to claim 6 to encapsulate the optical semiconductor element.

* * * * *